United States Patent
Dyer et al.

(10) Patent No.: US 11,387,838 B1
(45) Date of Patent: Jul. 12, 2022

(54) SAR ANALOG-TO-DIGITAL CONVERTER CALIBRATION

(71) Applicant: Microsoft Technology Licensing, LLC, Redmond, WA (US)

(72) Inventors: Kenneth Colin Dyer, Pleasanton, CA (US); John Paul Rankin, Raleigh, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/207,343

(22) Filed: Mar. 19, 2021

(51) Int. Cl.
*H03M 1/10* (2006.01)
*H03M 1/46* (2006.01)

(52) U.S. Cl.
CPC ......... *H03M 1/462* (2013.01); *H03M 1/1009* (2013.01)

(58) Field of Classification Search
CPC ...... H03M 1/1009; H03M 1/12; H03M 1/125; H03M 1/462; H03M 1/002; H03M 1/1245; H03M 1/126; H03M 1/38; H03M 1/46; H03M 1/0614; H03M 1/468; H03M 1/0624; H03M 1/50; H03M 1/00; H03M 1/1061; H03M 1/1033; H03M 1/06; H03M 1/0836; H03M 1/0682
USPC .................. 341/118–120, 141, 142, 159, 161
See application file for complete search history.

(56) References Cited

U.S. PATENT DOCUMENTS

| | | | |
|---|---|---|---|
| 4,367,456 A * | 1/1983 | Munter | H04B 14/04 327/306 |
| 4,535,318 A | 8/1985 | Duryee et al. | |
| 7,839,319 B2 * | 11/2010 | Nittala | H03M 1/462 341/162 |
| 8,138,790 B1 | 3/2012 | Doubler et al. | |
| 8,803,583 B2 | 8/2014 | Nedachi | |
| 8,907,827 B2 | 12/2014 | Basset et al. | |
| 9,106,249 B1 | 8/2015 | Dyer et al. | |
| 9,484,945 B1 * | 11/2016 | Wan | H03M 1/0863 |
| 9,485,039 B1 * | 11/2016 | Malkin | H04B 17/14 |
| 9,509,640 B2 | 11/2016 | Taylor et al. | |
| 9,680,492 B1 * | 6/2017 | Farley | H03M 1/0863 |
| 10,014,875 B1 | 7/2018 | Zanikopoulos et al. | |
| 10,389,374 B1 | 8/2019 | Khoshgard et al. | |

(Continued)

FOREIGN PATENT DOCUMENTS

CN 109584901 B 4/2021

OTHER PUBLICATIONS

Chen, et al., "40-Gb/s 0.7-V 2:1 MUX and 1:2 DEMUX with Transformer-Coupled Technique for SerDes Interface", In Journal of IEEE Transactions on Circuits and Systems I: Regular Papers, vol. 62, Issue 4, Apr. 2015, pp. 1042-1051.

(Continued)

*Primary Examiner* — Linh V Nguyen
(74) *Attorney, Agent, or Firm* — Fountainhead Law Group PC

(57) ABSTRACT

Embodiments of the present disclosure include techniques for calibrating analog-to-digital converters (ADCs), such as successive approximation register SAR ADCs. In one embodiment, a pattern is applied to the input of an ADC to produce digital output codes. Counts of the digital output codes are used detect errors and adjust a clock delay of a comparator in the ADC. In other embodiments, an ADC calibration circuit is coupled to a calibration algorithm executing on a remote server to calibrate one or more ADCs.

19 Claims, 11 Drawing Sheets

(56) References Cited

U.S. PATENT DOCUMENTS

| | | | |
|---|---|---|---|
| 10,454,488 B1 | 10/2019 | Monangi | |
| 10,454,492 B1* | 10/2019 | Shikata | H03M 1/466 |
| 10,551,226 B2 | 2/2020 | Luo et al. | |
| 10,715,165 B2 | 7/2020 | Kurahashi et al. | |
| 10,763,879 B1 | 9/2020 | Neto | |
| 10,897,262 B2 | 1/2021 | Kesavanunnithan et al. | |
| 2013/0057424 A1* | 3/2013 | Jeon | H03M 1/462 |
| | | | 341/158 |
| 2015/0042500 A1* | 2/2015 | Fujiwara | H03M 1/46 |
| | | | 341/155 |
| 2016/0079994 A1* | 3/2016 | Lee | H03M 1/181 |
| | | | 341/118 |
| 2017/0093418 A1* | 3/2017 | Baek | H03M 1/125 |
| 2019/0074845 A1* | 3/2019 | Nakamura | H03M 1/468 |
| 2019/0326919 A1* | 10/2019 | Pernull | H03M 1/125 |

OTHER PUBLICATIONS

"Understanding Sar Adcs: Their Architecture and Comparison With Other Adcs", Retrieved from: https://www.maximintegrated.com/en/design/technical-documents/tutorials/1/1080.html, Oct. 2, 2001, 13 Pages.

Dimitrijevic, et al., "Remote Wireless Calibration of Equipment in the Distributed Measurement Systems", 8th International Conference on Telecommunications in Modem Satellite, Cable and Broadcasting Services, Nov. 5, 2007, pp. 479-482.

* cited by examiner

SAR ANALOG-TO-DIGITAL CONVERTER CALIBRATION

BACKGROUND

The present disclosure relates generally to calibrating circuits, and more specifically, to the calibration of analog-to-digital converter circuits including successive approximation register (SAR) analog-to-digital converters.

Analog-to-digital converters (aka ADCs) are used in a wide range of electronic applications. ADCs convert analog (continuous) signals into digital values representing such signals. The digital signals can then be processed digitally using digital circuits (e.g., logic circuits). ADCs are used in a wide range of applications. One such application includes data communications. In a data communications application, ADCs may be used in receivers, where data is transmitted over an analog channel and converted to digital using an ADC in the receiver. Such ADCs are often required to provide accurate results at very high frequencies. Accordingly, it is common for such systems to calibrate the ADCs performance for the particular communication channel (e.g., a wired or wireless channel). Examples of such systems include serializer/deserializer (SERDES) circuits in wired systems as well as other receiver architectures in other wired or wireless systems.

One particular ADC that is useful in communications is a successive approximation register (SAR) analog-to-digital converter. SAR ADCs typically convert an analog input signal into digital codes by comparing the input voltage to different references (e.g., successively) to produce a digital value corresponding to the input signal. One problem with such converters is that errors can occur as the reference changes between discrete values, especially at very high speeds. For example, if the reference has not settled to a new value during a conversion, the comparison may be inaccurate and the resulting digital codes erroneous.

Additionally, ADC calibration techniques, in general, can be computationally limited by resources available to the ADC. ADCs are often implemented on an integrated circuit where compute power is balanced against space on the chip, for example.

DETAILED DESCRIPTION

Described herein are techniques for calibrating circuits. In the following description, for purposes of explanation, numerous examples and specific details are set forth in order to provide a thorough understanding of some embodiments. Various embodiments as defined by the claims may include some or all of the features in these examples alone or in combination with other features described below, and may further include modifications and equivalents of the features and concepts described herein.

Figure 1A:
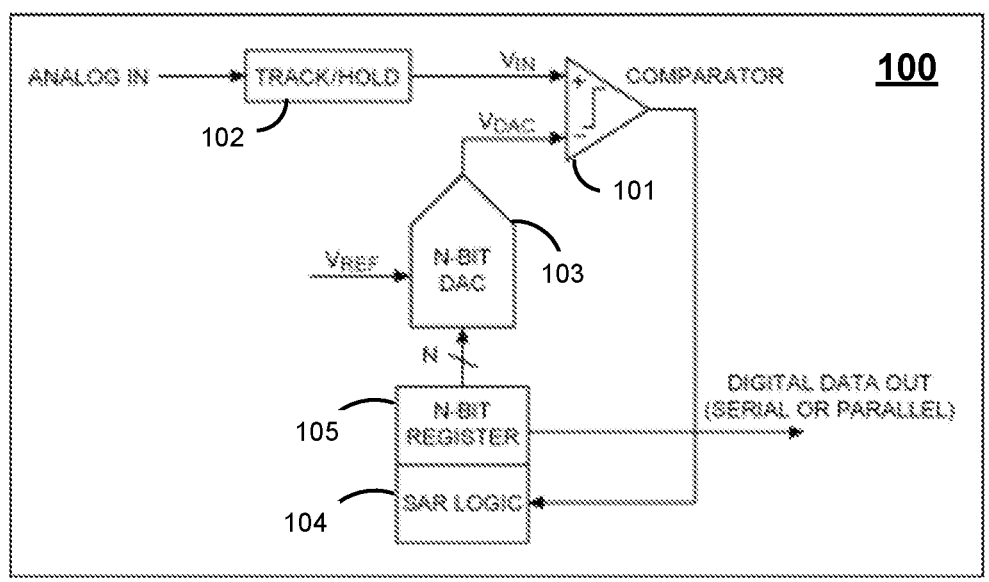
FIG. 1A illustrates an example successive approximation register analog-to-digital converter.

FIG. 1A illustrates an example successive approximation register (SAR) analog-to-digital converter (ADC) 100. SAR ADC 100 includes a track and hold circuit 102 (aka sample and hold) that receives an analog input signal (ANALOG IN) and outputs a sampled analog voltage (Vin) that is provided at one input of a comparator 101. The second input of comparator 101 receives a reference voltage, Vdac, from a digital-to-analog converter (DAC) 103. The output of comparator 101 is coupled to an SAR logic 104, which changes the digital value (or digital code) in an N-bit register 105 (e.g., up or down depending on the comparison of Vin and Vdac). The register is coupled to the input of an N-bit DAC 103, which also receives a reference voltage, Vref, to produce Vdac.

Figure 1B:
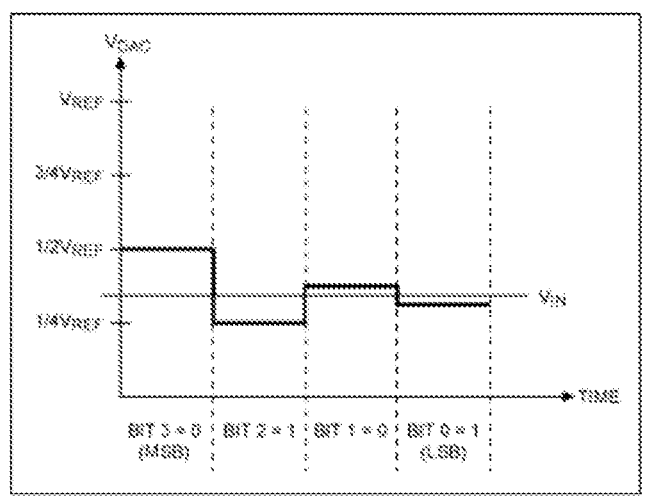
FIG. 1B illustrates resolution of bits of the example successive approximation register analog-to-digital converter in FIG. 1A.

FIG. 1B illustrates the resolution of bits of a successive approximation register (SAR) analog-to-digital converter 100. The operation of the circuit in FIG. 1A is illustrated in FIG. 1B. On a first conversion cycle, Vdac may be set to ½Vref and compared to Vin. If Vin is greater than Vdac, the most significant bit (MSB) is set to 1, and if Vin is less than Vdac, the MSB is set to 0. On the next conversion cycle, Vdac is reduced to ¼Vref (e.g., half the distance between the prior voltage and the next voltage above or below the prior voltage based on the comparator output) and compared to Vin. If Vin is greater than ¼Vref, the next significant bit is set to 1, and if Vin is less than ¼Vref, the next bit is set to 0. The process proceeds across multiple additional bits (e.g., 4 bits in this example), where Vdac is successively set one-half a previous reference voltage step above or below the value of the previous step, and thus converging to Vin. More generally, an SAR ADC is an ADC that translates an analog input value (voltage or current) into a digital value by comparing the input value to references (voltage or current) that converge on the input value. It is to be understood that SAR ADC 100 is just one example of an SAR ADC.

Figure 2A:
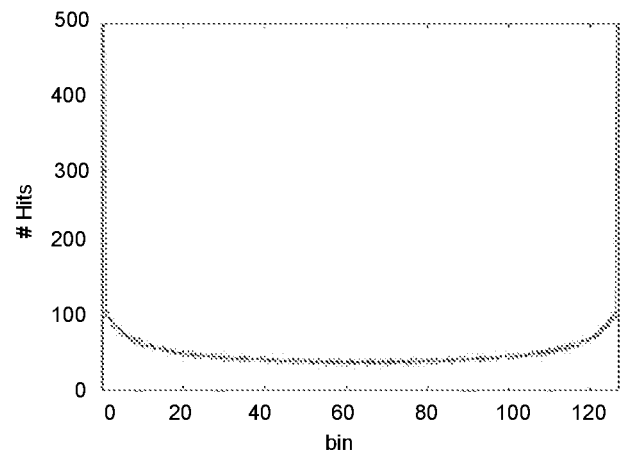
FIG. 2A illustrates an ideal sinewave histogram for an example successive approximation register analog-to-digital converter.

FIG. 2A illustrates an ideal histogram for a successive approximation register analog-to-digital converter. The histogram in FIG. 2A may comprise counts of the digital output codes across a range of analog input signal values for an input signal (here, a sine wave). Ideally, a sine wave input produces a smooth curve histogram as shown, where different digital output codes are stored in "bins" and each bin has a count indicating the number of times a particular digital output code was produced. Features and advantages of the present disclosure include calibrating analog-to-digital converters, such as SAR ADCs, based on such counts.

Figure 2B:
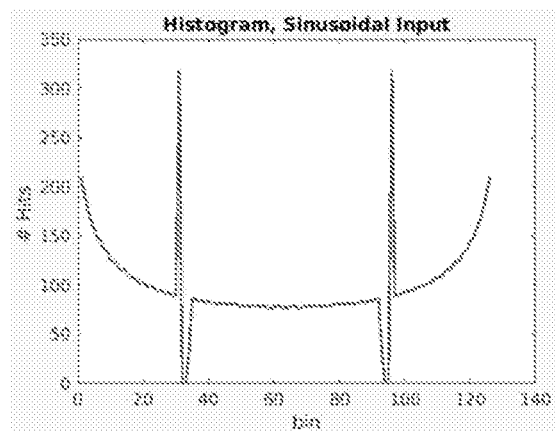
FIG. 2B illustrates errors in a histogram of a successive approximation register analog-to-digital converter.

FIG. 2B illustrates errors in a histogram of a successive approximation register analog-to-digital converter. FIG. 2B shows non-ideal counts for an SAR ADC with a sine wave input. FIG. 2B illustrates that errors in the conversion process result in distortion of the counts. In this example, the erroneous counts are in bins 31/32 and 95/96. It is to be understood that FIGS. 2A-B are for illustrative purposes only. More generally, embodiments of the present disclosure may detect errors in an ADC and correct such errors based on counts resulting from patterns applied to the inputs, for example.

Features and advantages of the present disclosure include applying a pattern of input signal values across a range to the input of an ADC and detecting errors in counts of digital output codes across the range. The errors in counts may be used to adjust configuration parameters of the ADC. For example, errors in counts may be used to adjust one or more delays of a clock signal to a comparator in the ADC to reduce errors in the counts. In some embodiments, calibration algorithms may be executed by remote servers (e.g., a cloud server) to analyze histograms and configure parameters (e.g., delays) of an ADC to improve performance.

Figure 3:
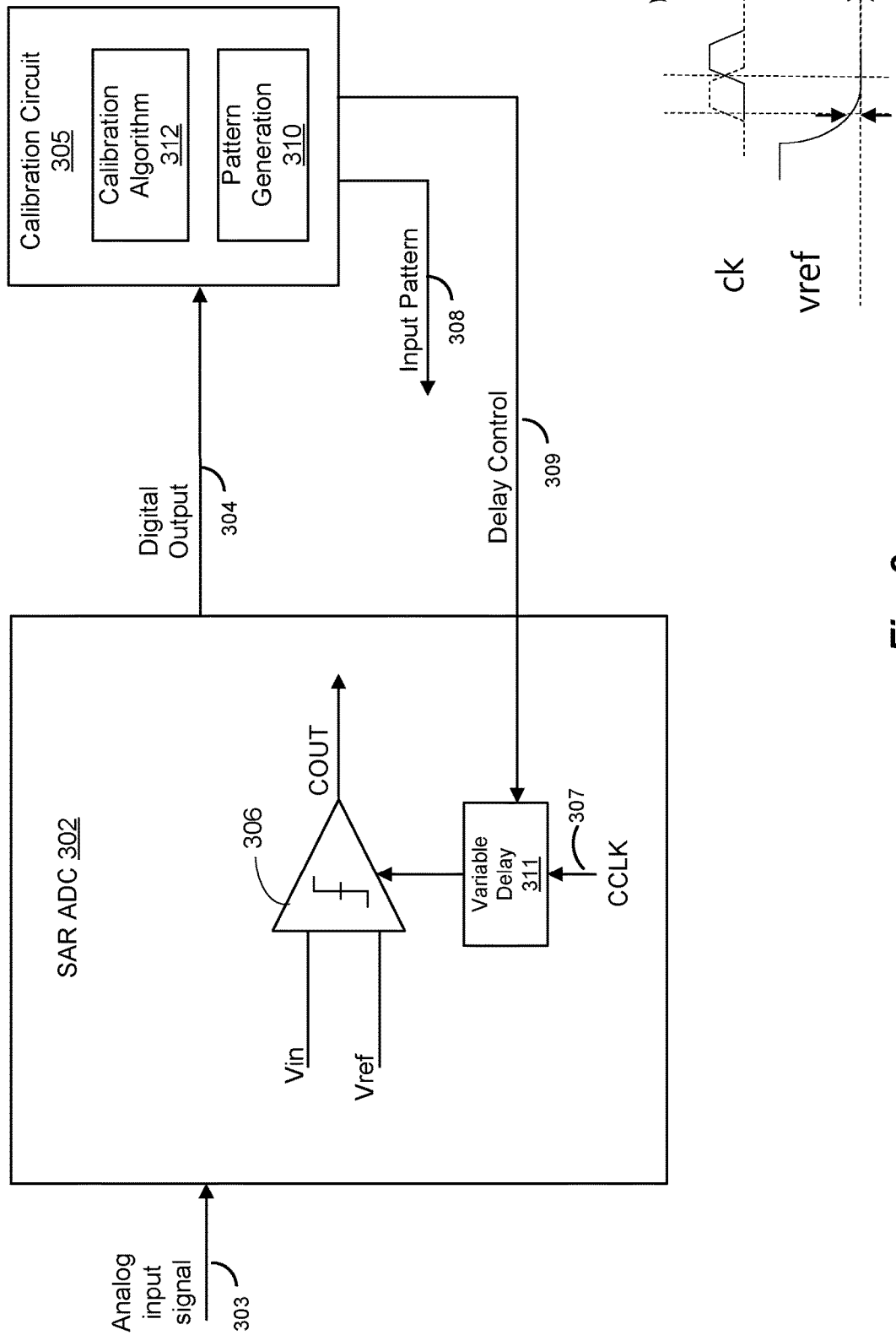
FIG. 3 illustrates a circuit including a successive approximation register analog-to-digital converter according to an embodiment.

FIG. 3 illustrates a circuit 300 including a successive approximation register analog-to-digital converter according to an embodiment. In this example, an SAR ADC 302 is configured to receive an analog input signal 303 and to generate a digital output code 304 corresponding to the analog input signal 303. SAR ADC 302 includes at least one comparator 306, which may have a first input coupled to receive an input voltage (e.g., from a sample and hold circuit, not shown) and a second input coupled to a reference voltage, Vref. SAR ADC 302 is used to generate the digital output code 304 in response to Vin. In this example, comparator 306 is coupled to a comparator clock (CCLK) signal 307 through a variable delay circuit 311. Circuit 300 further includes a calibration circuit 305 coupled to SAR ADC 302. Calibration circuit 305 provides an input signal pattern 308 across a range of analog input signal values to the SAR ADC 302. Pattern 308 may be generated by a pattern generator 310, for example. Pattern 308 may be coupled to the input 303, for example, during calibration. One example pattern may be a sinusoidal input (aka a sine wave). Another example that may be useful in some wired data communications systems is a pulse amplitude modulated (PAM) signal, such as PAM4, for example. It is to be understood that a variety of patterns may be used in various embodiments.

In response to the pattern 308, SAR ADC 302 generates digital output codes (e.g., digital values representing different levels of the input signal at a particular point in time). Features and advantages of the present disclosure include generating a plurality of counts of the digital output codes across the range of analog input signal values in the pattern and using the counts to reduce or eliminate errors in SAR ADC 302. For example, errors in the counts may be detected and used to adjust the delay 311 of the comparator clock (CCLK) signal 307 to reduce the errors in the plurality of counts. A plot of the clock signal delay and Vref is illustrated at 301. As mentioned above, Vref may be the output of a DAC and may change over time. As Vref changes there may be a time delay before Vref settles to a new voltage. If the comparator clock is early, there may be an error, Verr, in Vref because Vref has not settled to a final value. This error may show up as distortions in the number of counts for corresponding digital output codes, for example. As illustrated at 301, delaying the comparator clock reduces Verr and results in a more accurate conversion. More specifically, in this example Vref may have a settling time relating to an exponential decay (e.g., with a time constant "tau"). Accordingly, the voltage error, Verr, may be expressed as follows:

$$Verr(t) = V_0 * e^{-T_s/tau}$$

where Ts is the time between the change in Vref and the comparison (e.g., the clock edge triggering the comparator) and Vo is a total change in Vref. By increasing Ts (e.g., delaying the clock edge) the error, Verr, decreases. Accordingly, increasing the delay can reduce the settling time error shown at 301. The reduction in Verr translates into the number of counts for the previously distorted bins being closer to an ideal number for the given pattern used. The result is that errors relating to particular analog input voltages and corresponding digital codes may be reduced or eliminated, for example.

In various embodiments, one or more delays may be adjusted based on one or more of the detected errors. In one embodiment, one or more delays may be adjusted when the one or more detected errors are above a threshold. For example, delays may be adjusted based on a difference between counts of two or more digital output codes. As an illustrative example, FIG. 2B shows an error for a 7-bit SAR ADC, where the digital output has an error between codes 95 (e.g., 1100000) and 96 (e.g., 1011111) and between 31 and 32. In one embodiment, the count error is calculated as a difference in hits over total hits (e.g., a percentage):

$$Error = (y[32] + y[95] - y[31] - y[96]) / (y[32] + y[95] + y[31] + y[96])$$

If the error is above a predetermined threshold, the system may iteratively increase the delay by a nominal amount until the error falls below the threshold. In other embodiments, the delay may be adjusted based on one or more counts of one or more particular digital output codes. For example, the system may iterate on a difference between counts for 95/96 and/or 31/32 until the difference falls below some predetermined threshold value (e.g., iterate until hits(31-32)<threshold AND hits(96-95)<threshold). In yet other embodiments, the system may monitor a count for a predetermined digital output code until a particular count falls below a predetermined threshold value (e.g., hits(32)<threshold). In many cases, the change in the reference for the MSB is the largest, and hence has the highest potential for error. Accordingly, the calibration circuit may adjust a delay corresponding to an MSB produced by the SAR ADC, for example. Because maintaining high speed and minimum delay is advantageous in some applications, the delay may initially be set to zero or some predetermined minimum amount, and incrementally increased until a final delay is realized that is the minimum required to get an acceptable level of error, for example. In various embodiments, the MSB and/or some or all of the other bits produced by the analog-to-digital converter may use particular associated delays during normal operation, which are determined as described herein to reduce errors.

Figure 4A:
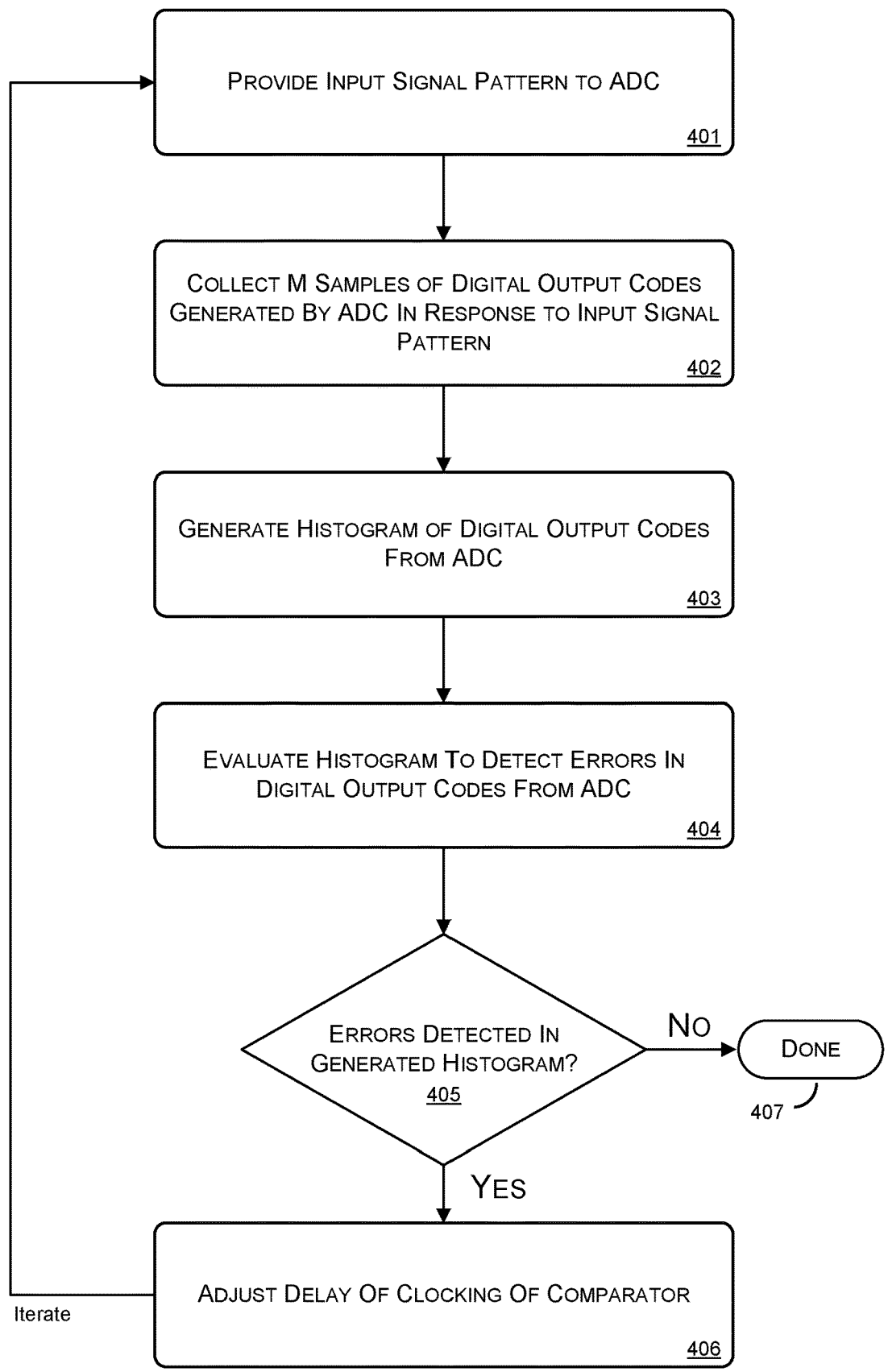
FIG. 4A illustrates calibrating a successive approximation register analog-to-digital converter according to an embodiment.

FIG. 4A illustrates calibrating a successive approximation register analog-to-digital converter according to an embodiment. The example method illustrated in FIG. 4A iteratively adjusts the delay to a comparator to remove errors. For example, at 401, an analog input signal pattern is provided to an input of a successive approximation register (SAR) analog-to-digital converter (ADC). The pattern may apply a range of analog input values to the input of the SAR ADC. In various embodiments, the analog input signal pattern causes the analog-to-digital converter to provide input voltages corresponding to all digital output codes across the range of analog input signal values. The range of the pattern may further cover the full range of the SAR ADC (e.g., the full range of input values for which digital codes may be generated). In response to the pattern, digital output codes are generated. Generating digital output codes in response to a range of input values may cause the calibration circuit to clock one or more comparator(s) in the SAR ADC, as described above. At 402, M (an integer) samples of output codes generated by the SAR ADC in response to the analog input signal pattern are collected. At 403, a histogram of digital output codes is generated. At 404, the histogram is evaluated (e.g., by a calibration algorithm) to detect errors in the digital output codes. At 405, if errors are detected, the clock (e.g., a trigger) of the comparator is adjusted (at 406) and the process repeats. The process may iterate until the error is sufficiently small (e.g., below a desired threshold), at which point the process is done at 407.

Figure 4B:
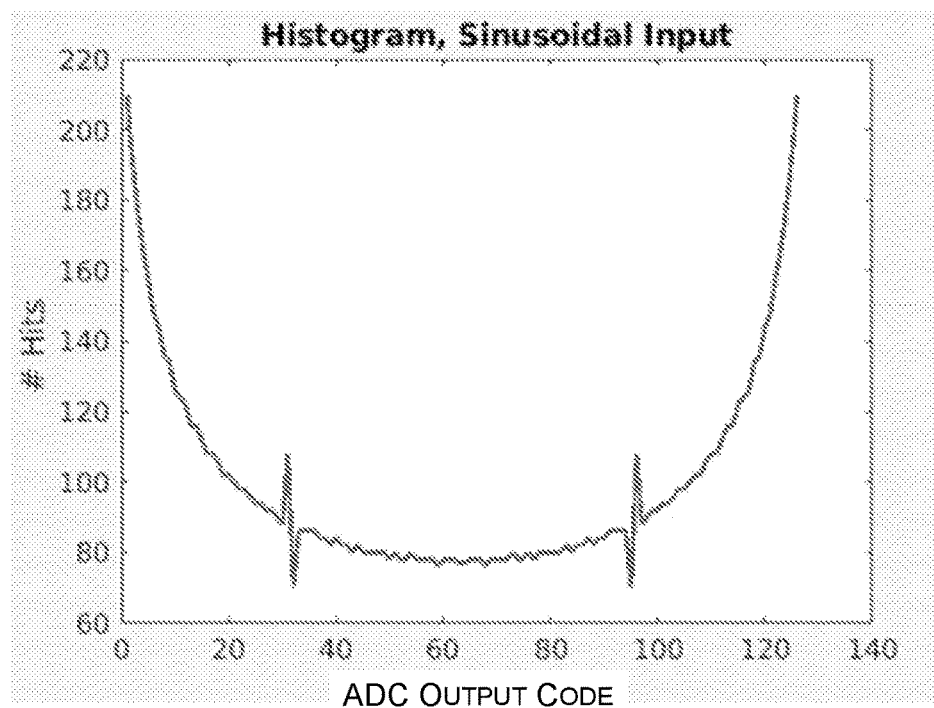
FIG. 4B illustrates error in a histogram of a calibrated successive approximation register analog-to-digital converter according to an embodiment.
Figure 4C:
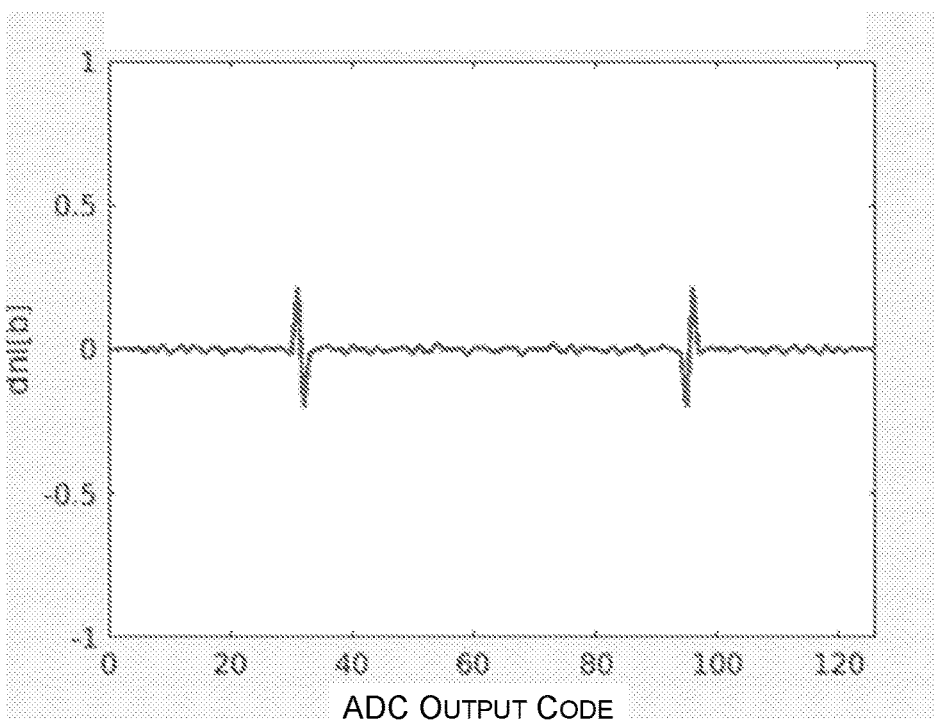
FIG. 4C illustrates differential non-linearity (DNL) in a histogram of a calibrated successive approximation register analog-to-digital converter according to an embodiment.

FIG. 4B illustrates error in a histogram of a calibrated successive approximation register analog-to-digital converter according to an embodiment. The example shown in FIG. 4B is for a 7-bit SAR ADC and has errors in codes 31/32 and 95/96. However, using the techniques described above the error has been reduced below a threshold, which may be set by design based on tradeoffs between maintaining high speed and accuracy, for example. FIG. 4C illustrates differential non-linearity (DNL) in a histogram of a calibrated successive approximation register analog-to-digital converter according to an embodiment. As illustrated in FIG. 4C, DNL is also reduced as the errors in the histogram are reduced using the techniques described herein.

Figure 5A:
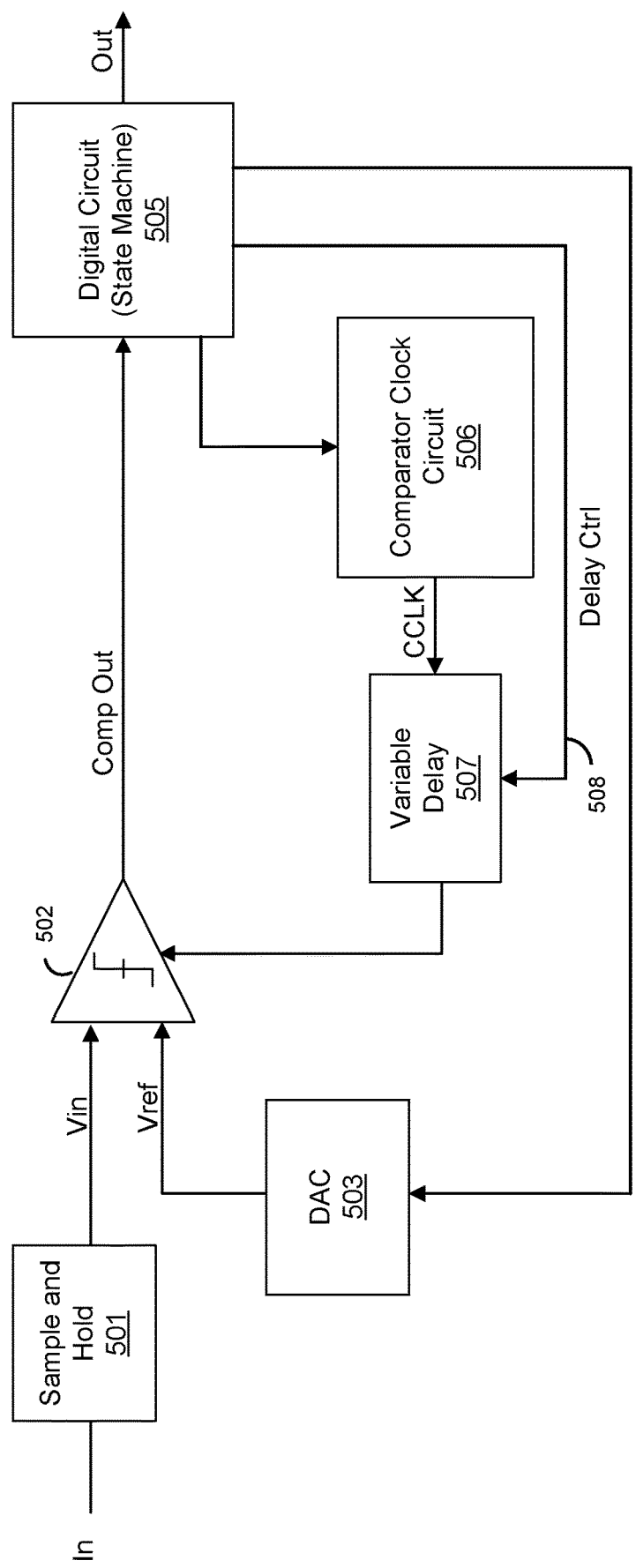
FIG. 5A illustrates an example successive approximation register analog-to-digital converter according to an embodiment.

FIG. 5A illustrates an example successive approximation register analog-to-digital converter according to an embodiment. In this example, an input voltage is received at the input, In, of a sample and hold (S/H) circuit 501. The input voltage may be a pattern that includes voltages across the full range of the SAR ADC so that all codes the SAR ADC is able to produce are (or should be) produced. The output of S/H 501 provides an input voltage, Vin, coupled to one input of comparator 502. Vin may be held for a certain time period (e.g., a sample and hold time) so that the comparator can compare it to a reference voltage, Vref, coupled to the other input of comparator 502. Vref is generated by a digital to analog converter (DAC) 503. The output of comparator 502 is coupled to a digital circuit 505, which may be a state machine, for example. Digital circuit 505 may program the DAC output voltage, Vref, for example. Digital circuit 505 may further control a comparator clock circuit 506, which provides a clock signal, CCLK, to comparator 502. CCLK may be a square wave, pulse, or edge to trigger the comparison, for example. Digital circuit 505 may further generate a delay control signal 518 to control variable delay 507. Digital circuit 505 may iteratively adjust the delay based on count errors to reduce such errors as described above. Histogram processing may be incorporated into digital circuit 505, for example, or alternatively performed by a separate component or on a remote server according to other advantageous features of the present disclosure.

Figure 5B:
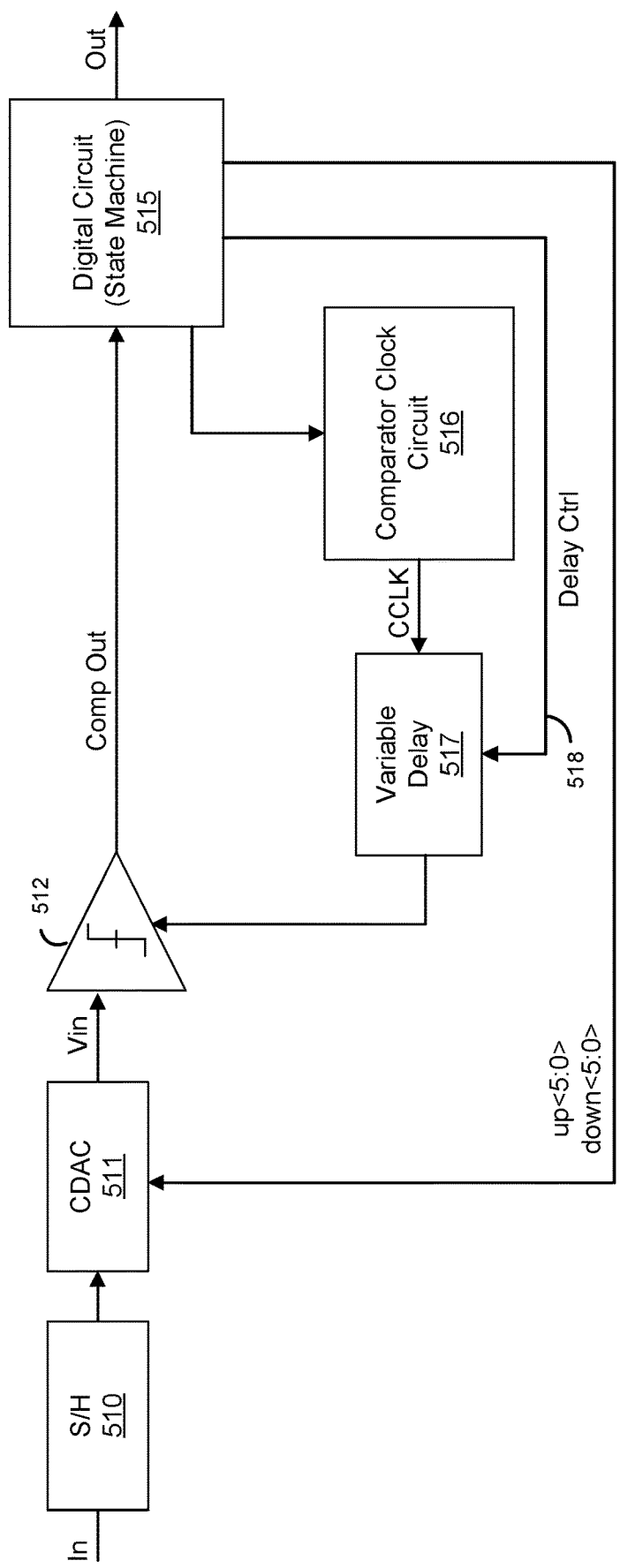
FIG. 5B illustrates another example successive approximation register analog-to-digital converter according to an embodiment.

FIG. 5B illustrates another example successive approximation register analog-to-digital converter according to an embodiment. In this example, an SAR ADC may include sample and hold 510, DAC 511, comparator 512, digital circuit (e.g., a state machine) 515, comparator clock circuit 516, and variable delay circuit 517 that perform calibration and delay adjustment as described above. In this example, DAC 511 is a capacitive digital to analog converter (CDAC). CDACs are a type of DAC that change the output voltage by selectively coupling plates of capacitors between reference voltages, such as a power supply or ground, for example. Digital circuit 515 may send digital "up" and "down" control signals to CDAC 511 to set Vin, which may operate differentially such that Vin converges on differential ground over multiple conversion cycles. Similar to the above embodiments, digital circuit 515 may generate delay control signal 518 to adjust the comparator clock delay, CCLK, to reduce errors in a histogram.

Figure 6:
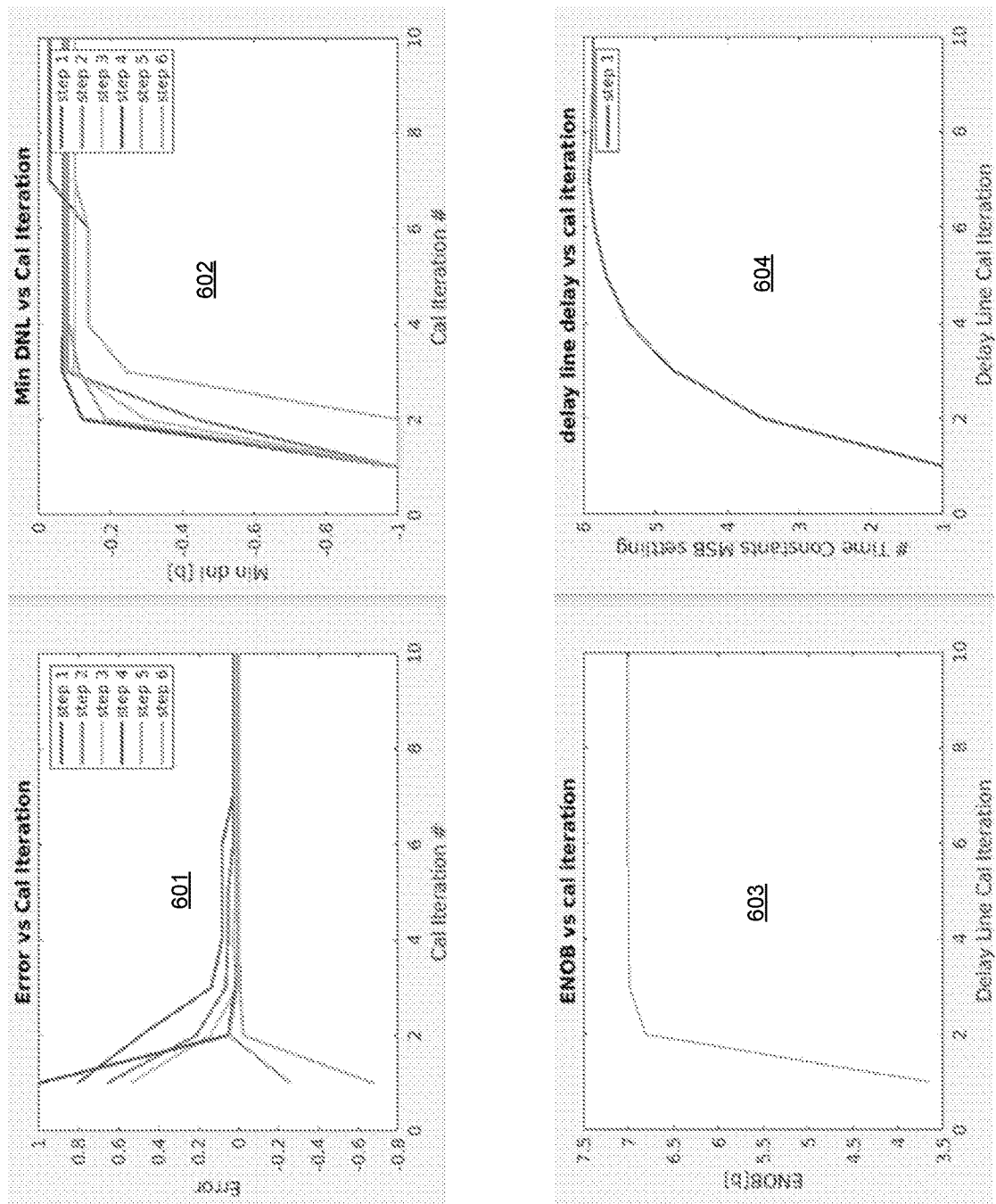
FIG. 6 illustrates plots of various metrics for multiple iterations of a successive approximation register analog-to-digital converter according to an embodiment.

FIG. 6 illustrates plots for multiple iterations of a successive approximation register analog-to-digital converter according to an embodiment. Plot 601 illustrates error over multiple calibration iterations (e.g., as illustrated in FIG. 4A). In plot 601, different steps refer to different bits. Accordingly, plot 601 illustrates settling error for different bits (e.g., step 1=MSB, step 2=MSB−1, etc. . . . ). As illustrated in plot 601, error for each step drops off to near zero within about 3 iterations for this example. Plot 602 illustrates the improvement in DNL over multiple iterations, where DNL similarly is reduced over just a few iterations. Plot 603 illustrates effective number of bits (ENOB), which increases to 7-bits in this example after 3 iterations. Plot 604 illustrates the adjusted delay (in terms of number time constants, "tau," for the MSB) over multiple iterations. Plot 604 illustrates that the delay may start at some nominal value (< >0) and increase. The optimum delay and threshold for error may be selected based on the values in the other plots at a particular iteration and other design factors, for example.

Figure 7:
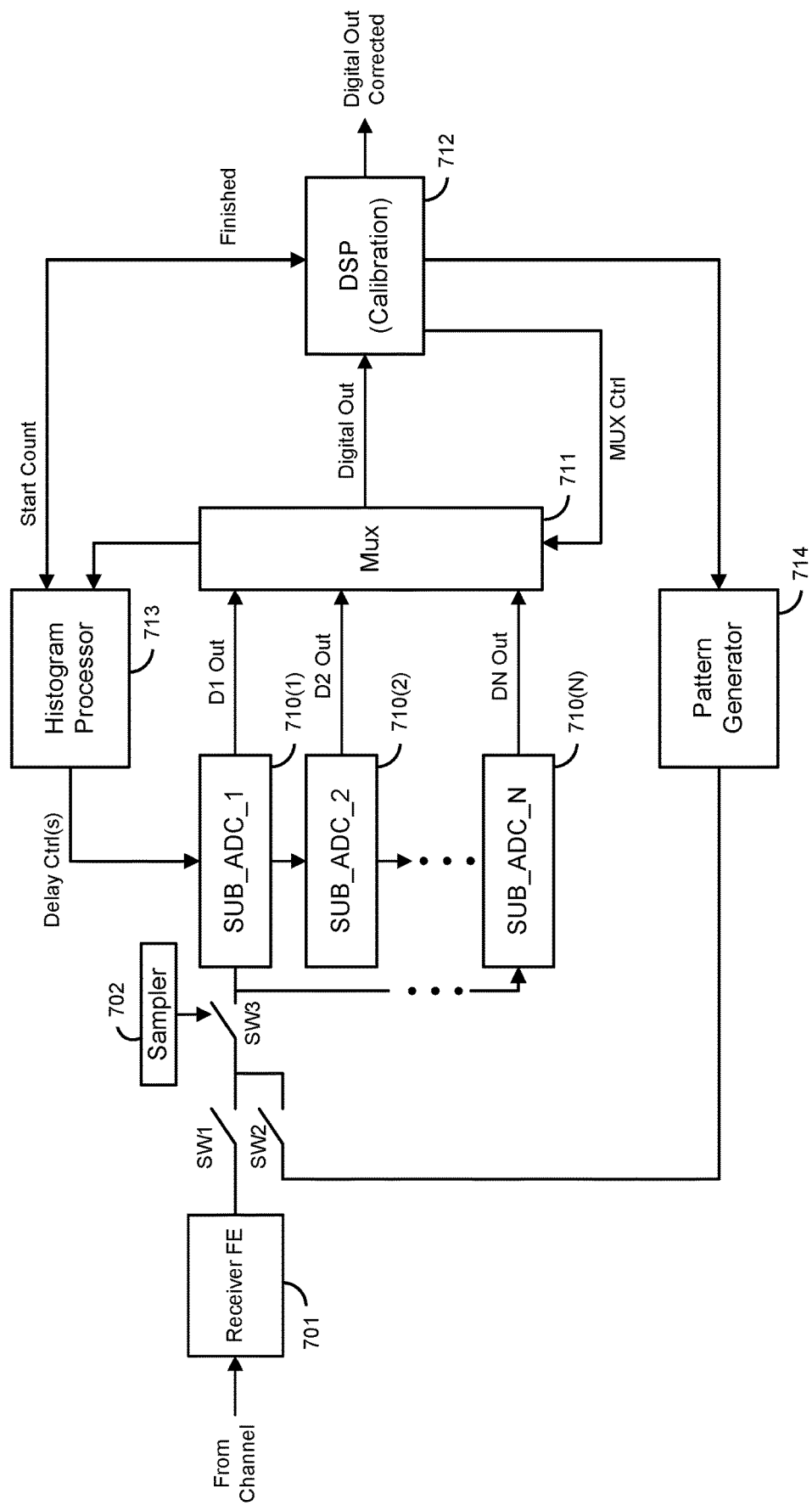
FIG. 7 illustrates an example serializer/deserializer including a successive approximation register analog-to-digital converter according to an embodiment.

Embodiments of the present disclosure may be used in a variety of electronic circuit applications. One particular application that may benefit from these techniques is high speed data communications (e.g., wired or wireless receivers). FIG. 7 illustrates an example serializer/deserializer (SERDES) including a plurality of SAR ADCs according to an embodiment. In this application, a receiver may include a receiver front end (FE) 701, coupled to the data channel, and a plurality of SAR ADCs 710(1)-(N) configured in parallel, each including the at least one comparator (as described above). SAR ADCs 710(1)-(N) receive and translate analog signals into digital codes, D1-DN, at very high speeds and may be considered as one ADC, where each block is sub-ADC, for example. In this example, there are N (an integer) sub-ADCs (SUB_ADC_1-SUB_ADC_N), each capable of generating digital output codes D1-DN across the full range of input values. Thus, each ADC may require calibration.

During a calibration phase (or calibration mode), switch SW1 is open and switch SW2 is closed and a pattern is coupled from pattern generator 714 to the inputs of the SAR ADCs 710(1)-(N). Sampler 702 and switch SW3 illustrate the sample and hold function in this example. The pattern may be applied to each of the SAR ADCs 710(1)-(N) to produce a plurality of histograms. The digital output codes for each ADC may be coupled through a multiplexer 711 to a histogram processor 713 configured to detect errors and histograms for each ADC and produce delay control signals to each ADC to adjust the delay until the errors fall below a threshold, for example. Histogram processor 713 may be a dedicated digital circuit, a local digital processor, or even an external process running on an external server, for example. A digital signal processor (DSP) 712 may control the calibration phase by signaling pattern generator 714 to send a pattern, signaling MUX 711 to route digital codes to histogram processor 713, and signaling histogram processor 713 to start the count. When the optimal delays are configured, histogram processor 713 may send a finished signal. In some embodiments, histogram processor 713 signals DSP 712 to generate the delay control signals. Once calibrated, SW2 is opened, SW1 is closed, and the outputs of the ADCs are coupled through DSP 712 for further calibration. DSP 712 produces calibrated and otherwise processed digital output data from the channel.

Figure 8:
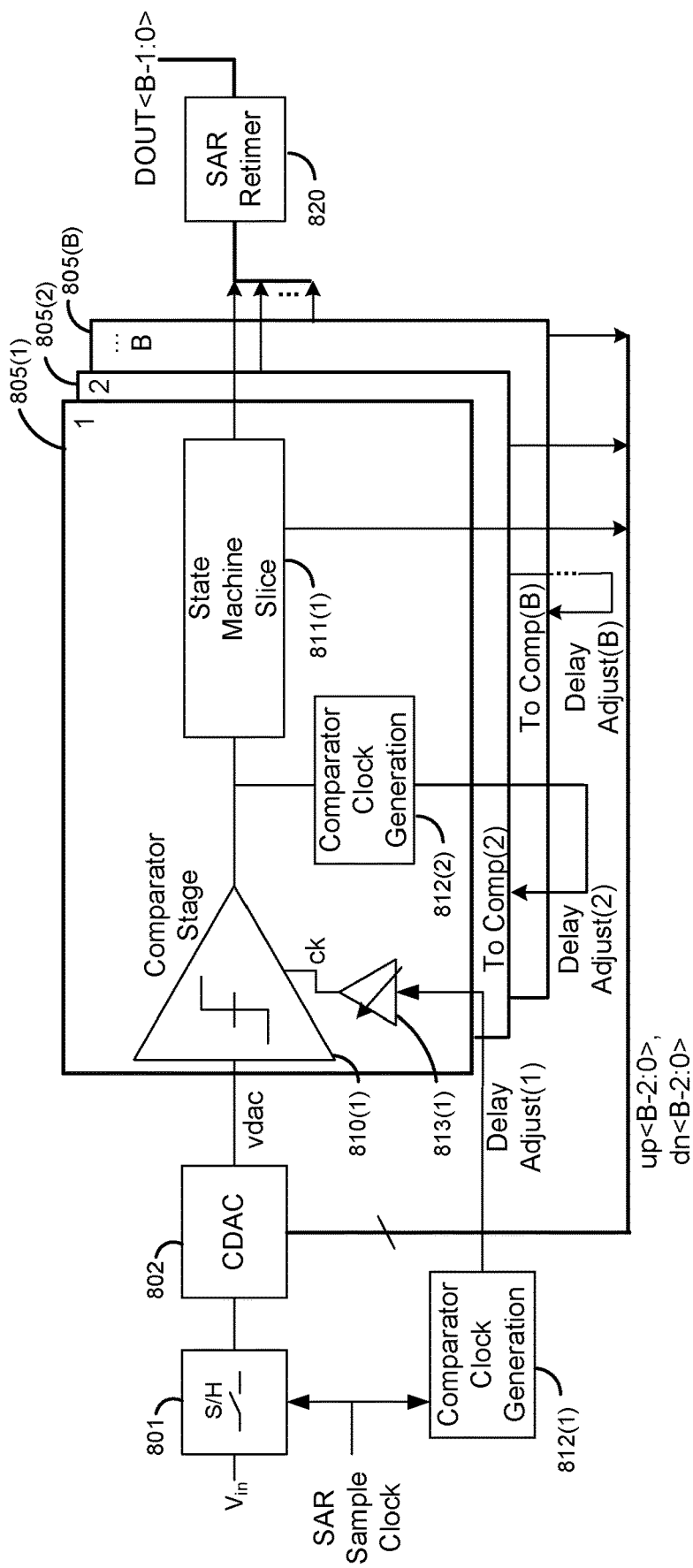
FIG. 8 illustrates another example successive approximation register analog-to-digital converter according to an embodiment.

FIG. 8 illustrates another example SAR ADC according to an embodiment. In this example, an SAR ADC includes a plurality of analog-to-digital converters 805(1)-(B) configured in parallel. Each ADC includes a comparator for each bit. Accordingly, the number of comparators is equal to the number (B) of bits of the digital output code. During a conversion cycle, an input voltage, Vin, such as a pattern, is coupled through sample and hold (S/H) 801 and CDAC 802. The output of CDAC 802 may be coupled to a plurality of ADC stages 805(1)-(B) configured in parallel. Each stage includes a comparator 810(1)-(B) and delay adjust circuit 813(1)-(B). As each sample of Vin is resolved by the ADC, state machines 811(1)-(B) adjust CDAC 802 to successively resolve B-bits at the output of each comparator. The bits may be recombined in retimer circuit 820, for example. A calibration circuit (not shown) may be configured to generate a separate delay control signal (e.g., delay adjust(1)-(B)) to adjust a separate delay circuit 813(1)-(B) for each of a plurality of comparator clock signals applied to the comparators from comparator clock generators 812(1)-(B). In this example, clock generators 812(1)-(B) are configured to successively provide clock signals to a subsequent comparator to resolve each bit. For instance, clock generator 812(1) generates a clock for comparator 810(1), an output of which is coupled to clock generator 812(2) to generate a clock for comparator 810(2) (not shown) in ADC 805(2), and so on for each ADC stage/bit. Parallel comparator approaches as illustrated here may be advantageous in high-speed applications to improve reliability (e.g., multiple lower speed/higher reliability comparators may be used in parallel rather than one higher speed comparator), speed (e.g., comparators may reset while another resolves a bit), and accuracy (e.g., comparators may be fine-tuned separately), for example. It is to be understood that during calibration, delay circuits 813(1)-(B) may be configured independently for each bit over multiple iterations of an input pattern to reduce or eliminate error as described above.

Figure 9:
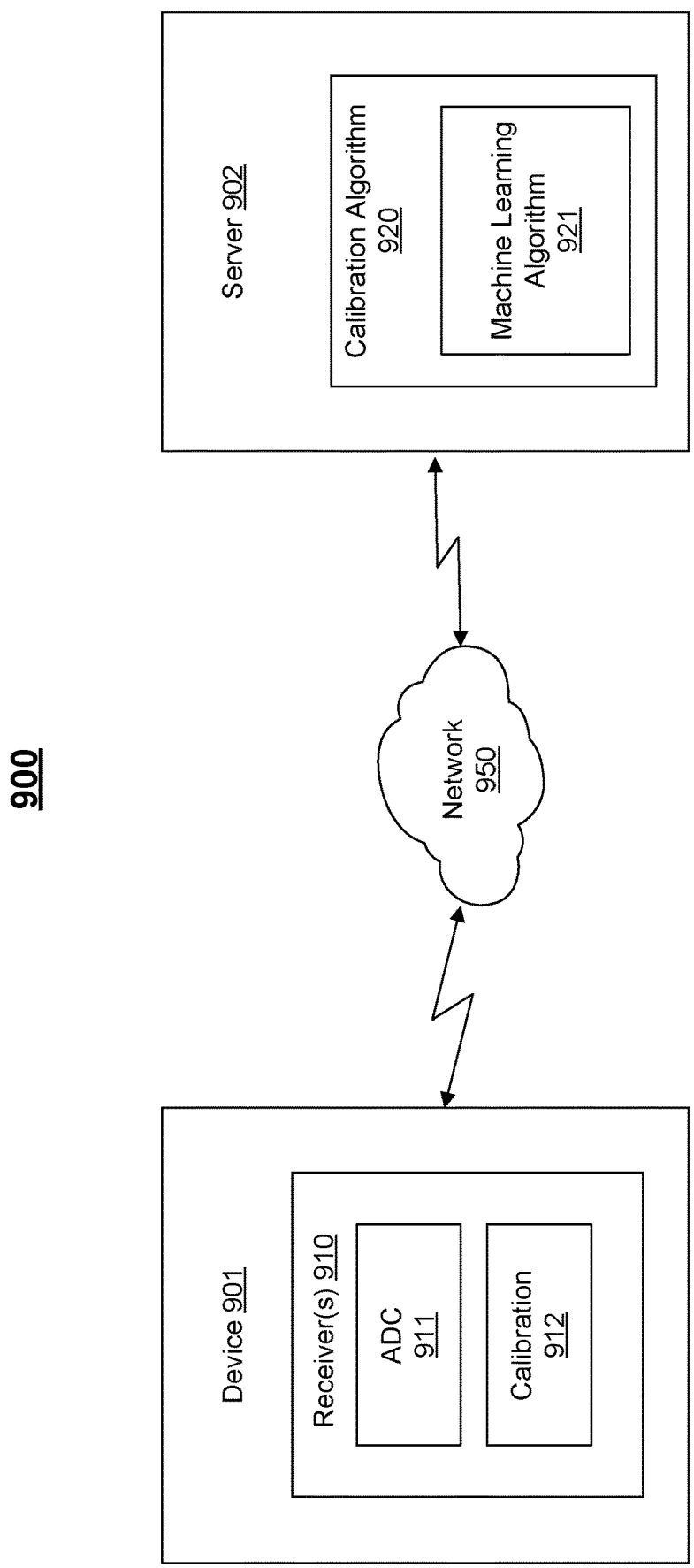
FIG. 9 illustrates calibration of an analog-to-digital converter over a network according to an embodiment.

FIG. 9 illustrates calibration of an analog-to-digital converter over a network according to an embodiment. As mentioned above, features and advantages of the present disclosure include calibration of analog-to-digital converters using algorithms running on remote servers. For example, in many applications there may be high speed connections between a device where an ADC is located and a server where more computationally intensive calibration algorithms may be executed. In this example, a device 901 includes one or more high speed data communications receiver(s) 910 including an ADC 911. ADC 911 may include an input configured to receive an analog input signal and is configured to generate a digital output code corresponding to the analog input signal. During a calibration phase, an ADC calibration circuit 912 communicates over network 950 with a calibration algorithm 920 executing on remote server 902. Network 950 may be any of a variety of high speed networks (e.g., Ethernet). Calibration circuit 912 may generate an analog input signal pattern. When the analog input signal pattern is provided on the input of the ADC 911 in device 901, the calibration algorithm 920 receives, over network 950, counts of the digital output codes generated by ADC 911 in response to the analog input signal pattern. Calibration algorithm 920 may adjust parameters of ADC 911, via communication with calibration circuit 912 over network 950, to calibrate ADC 911 based on the counts (e.g., based on a histogram). As mentioned above, in one example embodiment of this feature, calibration algorithm 920 executing on the remote server 902 detects errors in the plurality of counts and signals calibration circuit 912 to adjust one or more comparator delays. Features and advantages of some embodiments may process count information from ADC 911 using a machine learning algorithm 921 executing on server 902 to adjust parameters of ADC 911. For example, calibration algorithms executing on server 902 may be configured to perform statistical analysis to calibrate ADC timing errors, mismatch in capacitors, DC offset, gain, and the like.

FURTHER EXAMPLES

Each of the following non-limiting examples may stand on its own or may be combined in various permutations or combinations with one or more of the other examples.

In one embodiment, the present disclosure includes a circuit comprising: a successive approximation register analog-to-digital converter configured to receive an analog input signal and to generate a digital output code corresponding to the analog input signal, the analog-to-digital converter including at least one comparator used to generate the digital output code, wherein the at least one comparator is coupled to a comparator clock signal; and a calibration circuit coupled to the analog-to-digital converter, the calibration circuit providing an input signal pattern to the analog-to-digital converter to generate a plurality of counts of the digital output codes across a range of analog input signal values, wherein errors in the plurality of counts are detected and used to adjust at least one delay of the comparator clock signal to reduce the errors in the plurality of counts.

In another embodiment, the present disclosure includes a method of calibrating a successive approximation register analog-to-digital converter comprising: providing an analog input signal pattern to an input of the successive approximation register analog-to-digital converter; generating, by the successive approximation register analog-to-digital converter, a plurality of digital output codes representing the analog input signal pattern; clocking at least one comparator in the successive approximation register analog-to-digital converter as part of generating the plurality of digital output codes; generating a histogram of the digital output codes; detecting errors in the digital output codes from the histogram; and adjusting at least one delay of the clocking of the at least one comparator in response to the detected errors in the histogram.

In another embodiment, the present disclosure includes a system comprising: a device comprising one or more receivers, the one or more receivers comprising an analog-to-digital converter, the analog-to-digital converter having an input configured to receive an analog input signal and configured to generate a digital output code corresponding to the analog input signal; and a server coupled to the device over a network, the server including a calibration algorithm executable on the server, wherein when an analog input signal pattern is provided on the input of the analog-todigital converter in the device, the calibration algorithm receives, over the network, at least a plurality of counts of the digital output codes generated by the analog-to-digital converter in response to the analog input signal pattern, and wherein the calibration algorithm adjusts parameters of the analog-to-digital converter to calibrate the analog-to-digital converter based at least in part on the plurality of counts.

In one embodiment, at least one delay is adjusted when the one or more detected errors are above a threshold.

In one embodiment, at least one delay is adjusted across a plurality of iterations of providing the input signal pattern to the analog-to-digital converter to generate the plurality of counts, and wherein the at least one delay is incrementally increased on each iteration until the one or more detected errors are below the threshold.

In one embodiment, at least one delay is adjusted based on one or more of the detected errors.

In one embodiment, at least one delay is adjusted based on a difference between counts of two or more digital output codes.

In one embodiment, at least one delay is adjusted based on a count of a particular digital output code.

In one embodiment, the calibration circuit detects errors in one or more predetermined digital output codes.

In one embodiment, the calibration circuit adjusts at least one delay corresponding to a most significant bit produced by the analog-to-digital converter.

In one embodiment, the calibration circuit adjusts a plurality of delays corresponding to multiple bits produced by the analog-to-digital converter.

In one embodiment, different bits produced by the analog-to-digital converter use particular associated delays during normal operation.

In one embodiment, the plurality of counts of the digital output codes across the range of analog input signal values comprise a histogram.

In one embodiment, the input signal pattern causes the analog-to-digital converter to produce all digital output codes across the range of analog input signal values.

In one embodiment, the input signal pattern is a sine wave.

In one embodiment, the input signal pattern corresponds to a pulse amplitude modulated (PAM) input signal.

In one embodiment, the successive approximation register analog-to-digital converter comprises: a digital-to-analog converter configured to receive a digital input signal and to provide a reference voltage to the comparator, the reference voltage having a value based on the digital input signal; a clock circuit configured to generate a comparator clock signal; a variable delay circuit coupled to the clock circuit to receive the clock signal and coupled to receive a delay control signal, the variable delay circuit configured to generate a delayed clock signal having a delay based on the delay control signal; and a digital circuit configured to provide the digital input signal to the digital-to-analog converter and the delay control signal to the variable delay circuit.

In one embodiment, the digital-to-analog converter comprises a capacitive digital-to-analog converter.

In one embodiment, the circuit comprises a plurality of said analog-to-digital converters each including the at least one comparator, and wherein the plurality of the analog-to-digital converters are configured in parallel.

In one embodiment, the successive approximation register analog-to-digital converter comprises a plurality of comparators equal to a number of bits of the digital output code, and wherein the calibration circuit is configured to generate a separate delay control signal to adjust a separate delay of each of a plurality of comparator clock signals applied to the plurality of comparators.

In one embodiment, the calibration circuit communicates with a calibration algorithm executing on a remote server, and wherein the calibration algorithm executing on the remote server detects errors in the plurality of counts and signals the calibration circuit to adjust the at least one delay.

In another embodiment, the present disclosure includes a method of calibrating an analog-to-digital converter comprising: providing an analog input signal pattern to an input of a successive approximation register analog-to-digital converter; generating by the successive approximation register analog-to-digital converter a plurality of digital output codes representing the analog input signal pattern; clocking at least one comparator in the successive approximation register analog-to-digital converter as part of generating the plurality of digital output codes; generating a histogram of the digital output codes generated by the successive approximation register analog-to-digital converter; detecting errors in the digital output codes from the histogram; and adjusting at least one delay of the clocking of the at least one comparator in response to the detected errors in the histogram.

In another embodiment, the present disclosure includes a system comprising: a device comprising one or more receivers, the one or more receivers comprising an analog-to-digital converter, the analog-to-digital converter having an input configured to receive an analog input signal and configured to generate a digital output code corresponding to the analog input signal; and a server coupled to the device over a network, the server including a calibration algorithm executable on the server, wherein when an analog input signal pattern is provided on the input of the analog-to-digital converter in the device, the calibration algorithm receives, over the network, at least a plurality of counts of the digital output codes generated by the analog-to-digital converter in response to the analog input signal pattern, and wherein the calibration algorithm adjusts parameters of the analog-to-digital converter to calibrate the analog-to-digital converter based at least in part on the plurality of counts.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. A circuit comprising:
a successive approximation register analog-to-digital converter configured to receive an analog input signal and to generate a plurality of digital output codes corresponding to a plurality of analog input signal values of the analog input signal, the analog-to-digital converter including at least one comparator used to generate the digital output codes, wherein the at least one comparator is coupled to a comparator clock signal; and
a calibration circuit coupled to the analog-to-digital converter, the calibration circuit providing an input signal pattern to the analog-to-digital converter to generate a plurality of counts of the digital output codes across a range of analog input signal values, wherein each of the plurality of counts indicates a number of times a particular digital output code corresponding to a particular analog input signal value was generated, wherein errors in the plurality of counts are detected and used to adjust at least one delay of the comparator clock signal to reduce the errors in the plurality of counts.

2. The circuit of claim 1, wherein the at least one delay is adjusted when the one or more detected errors are above a threshold.

3. The circuit of claim 2, wherein the at least one delay is adjusted across a plurality of iterations of providing the input signal pattern to the analog-to-digital converter to generate the plurality of counts, and wherein the at least one delay is incrementally increased on each iteration until the one or more detected errors are below the threshold.

4. The circuit of claim 1, wherein the at least one delay is adjusted based on one or more of the detected errors.

5. The circuit of claim 4, wherein the at least one delay is adjusted based on a difference between counts of two or more digital output codes.

6. The circuit of claim 4, wherein the at least one delay is adjusted based on a count of a particular digital output code.

7. The circuit of claim 1, wherein errors are detected in one or more predetermined digital output codes.

8. The circuit of claim 1, wherein the calibration circuit adjusts at least one delay corresponding to a most significant bit produced by the analog-to-digital converter.

9. The circuit of claim 1, wherein the calibration circuit adjusts a plurality of delays corresponding to multiple bits produced by the analog-to-digital converter.

10. The circuit of claim 1, wherein different bits produced by the analog-to-digital converter use particular associated delays during normal operation.

11. The circuit of claim 1, wherein the input signal pattern causes the analog-to-digital converter to produce all digital output codes across the range of analog input signal values.

12. The circuit of claim 1, wherein the input signal pattern is a sine wave.

13. The circuit of claim 1, wherein the input signal pattern corresponds to a pulse amplitude modulated (PAM) input signal.

14. The circuit of claim 1, wherein the successive approximation register analog-to-digital converter comprises:
a digital-to-analog converter configured to receive a digital input signal and to provide a reference voltage to the comparator, the reference voltage having a value based on the digital input signal;

a clock circuit configured to generate a comparator clock signal;
a variable delay circuit coupled to the clock circuit to receive the comparator clock signal and configured to receive a delay control signal, the variable delay circuit generating a delayed clock signal having a delay based on the delay control signal; and
a digital circuit configured to provide the digital input signal to the digital-to-analog converter and the delay control signal to the variable delay circuit.

15. The circuit of claim 14, wherein the digital-to-analog converter comprises a capacitive digital-to-analog converter.

16. The circuit of claim 1, wherein the circuit comprises a plurality of said analog-to-digital converters each including the at least one comparator, and wherein the plurality of the analog-to-digital converters are configured in parallel.

17. The circuit of claim 1, wherein the successive approximation register analog-to-digital converter comprises a plurality of comparators equal to a number of bits of the digital output code, and wherein the calibration circuit is configured to generate a separate delay control signal to adjust a separate delay of each of a plurality of comparator clock signals applied to the plurality of comparators.

18. The circuit of claim 1, wherein the calibration circuit communicates with a calibration algorithm executing on a remote server, and wherein the calibration algorithm executing on the remote server detects errors in the plurality of counts and signals the calibration circuit to adjust the at least one delay.

19. A method of calibrating a successive approximation register analog-to-digital converter comprising:
providing an analog input signal pattern to an input of the successive approximation register analog-to-digital converter;
generating, by the successive approximation register analog-to-digital converter, a plurality of digital output codes representing the analog input signal pattern;
clocking at least one comparator in the successive approximation register analog-to-digital converter as part of generating the plurality of digital output codes;
generating a histogram of the digital output codes;
detecting errors in the digital output codes from the histogram; and
adjusting at least one delay of the clocking of the at least one comparator in response to the detected errors in the histogram.

* * * * *